US006593061B2

(12) United States Patent
Hotta

(10) Patent No.: US 6,593,061 B2
(45) Date of Patent: Jul. 15, 2003

(54) HEAT-SENSITIVE LITHOGRAPHIC PRINTING PLATE, AND SUBSTRATE FOR THE PLATE AND METHOD OF PRODUCING THE SAME

(75) Inventor: Yoshinori Hotta, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 175 days.

(21) Appl. No.: 09/805,547

(22) Filed: Mar. 14, 2001

(65) Prior Publication Data

US 2002/0025493 A1 Feb. 28, 2002

(30) Foreign Application Priority Data

Mar. 15, 2000 (JP) ..................................... P2000-072359
Apr. 19, 2000 (JP) ..................................... P2000-118171

(51) Int. Cl.[7] .................................................. G03F 7/11

(52) U.S. Cl. ................................ 430/278.1; 430/271.1; 430/138; 430/302; 430/348; 430/495.1; 430/496; 101/454; 101/463.1; 101/465

(58) Field of Search .............................. 430/138, 270.1, 430/271.1, 278.1, 302, 303, 348, 495.1, 496, 944, 945; 101/453, 454, 463.1, 465

(56) References Cited

U.S. PATENT DOCUMENTS

| | | | | | |
|---|---|---|---|---|---|
| 4,060,032 | A | * | 11/1977 | Evans | 101/401.1 |
| 4,225,663 | A | * | 9/1980 | Ball | 430/303 |
| 5,304,267 | A | * | 4/1994 | Vrotacoe et al. | 156/86 |
| 5,553,541 | A | * | 9/1996 | Vrotacoe et al. | 101/217 |
| 5,768,990 | A | * | 6/1998 | Vrotacoe et al. | 101/217 |
| 6,337,136 | B1 | * | 1/2002 | Suzuki et al. | 428/472 |
| 6,418,850 | B2 | * | 7/2002 | Ray et al. | 101/455 |
| 2002/0069777 | A1 | * | 6/2002 | Rossini et al. | |

FOREIGN PATENT DOCUMENTS

| | | |
|---|---|---|
| EP | 0471351 A1 | 2/1992 |
| EP | 0787583 A2 | 8/1997 |
| WO | WO 93/09957 | 5/1993 |

* cited by examiner

*Primary Examiner*—Rosemary Ashton
*Assistant Examiner*—Barbara Gilliam
(74) *Attorney, Agent, or Firm*—Burns, Doane, Swecker & Mathis, LLP

(57) ABSTRACT

Provided is a heat-sensitive lithographic printing plate comprising a support having thereon an undercoat layer and a heat-sensitive layer in this order, with at least one of the undercoat layer and the heat-sensitive layer comprising polymer hollow microspheres having voids on the inside, or a heat-sensitive lithographic printing plate comprising a support having thereon a heat-sensitive layer, with the heat-sensitive layer comprising polymer hollow microspheres having voids on the inside.

5 Claims, 3 Drawing Sheets

HEAT-SENSITIVE LITHOGRAPHIC PRINTING PLATE, AND SUBSTRATE FOR THE PLATE AND METHOD OF PRODUCING THE SAME

FIELD OF THE INVENTION

The present invention relates to a heat-sensitive lithographic printing plate, particularly a heat-sensitive lithographic printing plate wherein images are formed by the action of heat, and further to a substrate used therein and a method of producing such a substrate. More specifically, the present invention relates to a heat-sensitive lithographic printing plate capable of forming images by low-energy or short-duration laser irradiation, and further to a substrate used therein.

BACKGROUND OF THE INVENTION

In a heat-sensitive lithographic printing plate of the type which contains in its heat-sensitive layer a light-to-heat converting material capable of absorbing near infrared laser beams and converting the absorbed beams into heat, images for printing are formed through a process that the heat-sensitive layer gets heated in areas irradiated with near infrared beams, thereby causing an increase in solubility to alkali or heat curing in the foregoing areas to form images, and the non-image areas are dissolved and removed by development-processing.

As to the sensitivity in such a system, a matter of concern is not how much energy (i.e., much absolute value) is applied in gross by laser-beam irradiation, but the problems are how to convert the light energy into heat at great efficiency and how to efficiently raise a temperature of the heat-sensitive layer by the converted heat.

The former problem has been studied diversely from the viewpoints of newly developing light-to-heat converting materials, providing a reflection layer and devising layer structures to attain the purpose.

The latter problem has been supposed to be caused mainly by diffusion of heat generated in the heat-sensitive layer into a metallic support, and so it has been examined from the viewpoint of inhibition of thermal diffusion. As a result, the heat-insulating layers and the supports made of heat-insulating materials as described below are disclosed.

For instance, JP-A-11-65105 (the term "JP-A" as used herein means an "unexamined published Japanese patent application") proposes to provide a heat-insulating layer containing a polyvinyiphosphonic acid in an amount of 0.001 to 10 mg/$m^2$ on an anodically oxidized film. For actually producing the intended effected by the formation of a heat-insulating layer, however, the heat-insulating layer is required to have a certain thickness or above. As a result, the heat-insulating layer presents a problem of adhesion to a heat-sensitive layer or a support and causes film-residue trouble. support and causes a film-remaining trouble.

JP-A-10-39496 specifies the thermal conductivity of a support, and proposes a method of using polyethylene terephthalate having a low conductivity or foamed polyethylene terephthalate still lower in conductivity. And the heat-sensitive lithographic printing plates utilizing polyethylene terephthalate as support are already on the market.

In addition, the composite support formed by bonding a polyethylene terephthalate film as heat-insulating layer to an aluminum support has been proposed, and it is commercially available. In the case of using such an organic material, however, there occurs a problem that traditional arts for an aluminum support-used PS plate, inclusive of the art of close adhesion, the art of rendering the support surface hydrophilic and the art of improving printing quality through the surface water control, cannot be applied to the composite support as described above.

As mentioned above, many techniques for preventing thermal diffusion into a metallic support, such as the prevention by providing a heat-insulating layer or making a support from a heat-insulating material, have been proposed. With the current state of the arts, however, the market's demands for diminution of laser energy required for image formation and reduction in writing time are not sufficiently satisfied yet.

On the other hand, no arts based on the viewpoint of inhibiting the thermal diffusion in a heat-sensitive layer (image-forming layer) are disclosed yet.

SUMMARY OF THE INVENTION

Therefore, an object of the present invention is to solve the aforementioned various pending problems. More specifically, one object of the present invention is to provide a heat-sensitive lithographic printing plate wherein the diffusion of heat into its aluminum support is inhibited to enable image formation by irradiation with laser at a lower energy level.

Other objects of the present invention are to provide a substrate for lithographic printing plate, which can inhibit the heat diffusion into an aluminum support, has water receptivity equivalent to those of anodically oxidized supports hitherto used for printing plates and can ensure image formation by laser irradiation at a lower energy level, and to provide a method of producing such a substrate.

As a result of our intensive study on methods of inhibiting the diffusion of heat inside the image-forming layer while making use of the techniques for supports having water-receptive surfaces, it has been found that the diffusion of heat can be inhibited and images can be formed with a low-energy laser irradiation when polymer hollow microspheres, each of which is walled with a highly cross-linked polymer film and has a void on the inside, are added to a heat-sensitive layer (or an image-forming layer) or an undercoat layer provided on a support, thereby achieving the present invention.

Further, it has been found that when the substrate used for a lithographic printing plate comprises an aluminum support, a layer of hollow microspheres and an aluminum hydrate or oxide layer, which are arranged in order of description, the heat diffusion can be inhibited, images can be formed by irradiation with low-energy laser, and besides, the water-receptive surface similar to usual ones can be obtained, thereby completing the present invention.

More specifically, the following are primary embodiments and preferred embodiments of the present invention:

(1) A heat-sensitive lithographic printing plate comprising a support having thereon an undercoat layer and a heat-sensitive layer in this order, at least one of said undercoat layer and said heat-sensitive layer comprising polymer hollow microspheres having voids on the inside.

(2) A heat-sensitive lithographic printing plate comprising a support having thereon a heat-sensitive layer, said heat-sensitive layer comprising polymer hollow microspheres having voids on the inside.

(3) The heat-sensitive lithographic printing plate as described in Embodiment (1), wherein the support is an aluminum sheet or an aluminum alloy sheet and the undercoat layer is covered with a filmy layer of aluminum hydrate and/or aluminum oxide.

(4) The heat-sensitive lithographic printing plate as described in Embodiment (3), wherein the filmy layer of aluminum hydrate is formed by a hydration treatment, and the filmy layer of aluminum oxide is formed by subjecting the filmy layer of aluminum hydrate to a anodic oxidation treatment.

(5) A substrate for a lithographic printing plate comprising an aluminum or aluminum alloy sheet support, further having on the support an undercoat layer comprising hollow microspheres and a filmy layer of aluminum hydrate and/or aluminum oxide in this order.

(6) A method of producing a substrate for a lithographic printing plate, comprising steps of:

providing an undercoat layer comprising hollow microspheres on an aluminum or aluminum alloy sheet support, and forming a filmy layer of aluminum hydrate by subjecting the undercoat layer to hydrate treatment.

(7) A method of producing a substrate for a lithographic printing plate, comprising steps of:

providing an undercoat layer comprising hollow microspheres on an aluminum or aluminum alloy sheet support, forming a filmy layer of aluminum hydrate by subjecting the undercoat layer to hydrate treatment, and forming on the filmy layer of aluminum hydrate an oxide film layer as the topmost layer by subjecting the filmy layer to anodic oxidation treatment.

As to the addition of a granular substance to a layer which is formed on a support as a constituent of a heat-sensitive lithographic printing plate, the following techniques have been proposed.

For instance, the method of incorporating particles having an average diameter of 50 $\mu$m or less into a UV absorbent-added layer provided on a light-sensitive layer constituting a lithographic printing plate is disclosed in JP-A-7-311458.

JP-A-9-29924 discloses the method of improving image strength by adding a granular substance to an image-receiving layer provided underneath an image-forming layer capable of fusing by heating via exposure so that voids measuring 0.01 to 10 $\mu$m in size are formed and making the image-receiving layer go into the voids under fusing.

JP-A-11-48630 discloses the technique of improving stain resistance and abrasion resistance in non-image areas by using hydrophilic binder and granular inorganic filler in combination to form a non-image area layer having a porous structure specified by a voidage of 30 to 80% and an average void diameter of 0.05 to 1 $\mu$m.

Most of the granular substances added in the present inventions described above are inorganic particles, and they are not intended for inhibition of thermal diffusion.

On the other hand, JP-A-11-268439 and JP-A-11-309953 disclose the image layers to which particles are added. In these cases, the particles are defined as water-insoluble particles including organic particles, but the gist of such techniques is considered to consist in formation of a porous structure by making use of gaps among particles.

In the case of adopting the above-described means of providing layers of fine particles, the fine particles are fixed in the layers with the aid of binders. However, it is very difficult to make those layers have water receptivities on the same level as those of well-known anodically oxidized films.

A striking feature of polymer particles used in the heat-sensitive lithographic printing plates of the present invention consists in that the polymer particles are hollow particles (including hollow microspheres) and enclose therein a gas phase (air) which can promise greater heat-insulating effect than an organic material forming their respective envelopes.

In a heat-sensitive lithographic printing plate of the present invention, the undercoat layer or the heat-sensitive layer provided on a support contains polymer hollow microspheres, which each have a void on the inside and are enclosed with a highly cross-linked polymer. By the incorporation of such particles, the diffusion of heat can be inhibited and the heat generated through light-to-heat conversion can be utilized efficiently for the image formation. Accordingly, a saving in laser energy required for image formation can be achieved and the writing time can be shortened. As a result, it becomes possible to use cheap laser devices of low power, and so the cost of a plate-making system can be reduced.

In accordance with the substrate used for a lithographic printing plate and the method for production thereof, of the present invention, a layer comprising hollow microspheres (sometimes, referred to as an undercoat layer) is provided on a support, and further thereon a layer of aluminum hydrate or oxide is provided. By these layers arranged on a support, the diffusion of heat can be inhibited, and the heat generated through light-to-heat conversion can be utilized efficiently for the image formation. Thus, a saving in laser energy required for image formation can be effected and the writing time can be shortened. As a result, it becomes possible to use cheap laser devices of low power, and so the cost of a plate-making system can be reduced.

A cross-section view showing an example of a layer structure of a substrate of the present invention and a heat-sensitive lithographic printing plate using such a substrate is exhibited hereinafter as FIG. 4. Therein, the substrate 15 for a lithographic printing plate of the present invention has an undercoat layer containing hollow microspheres 12 on the surface of an aluminum support 11, and further has on the undercoat layer an aluminum hydrate or oxide layer 13 so as to cover the hollow microspheres 12. And the layer on the substrate 15 is an image-forming layer (heat-sensitive layer) 14 formed on the substrate 15.

Figure 1:
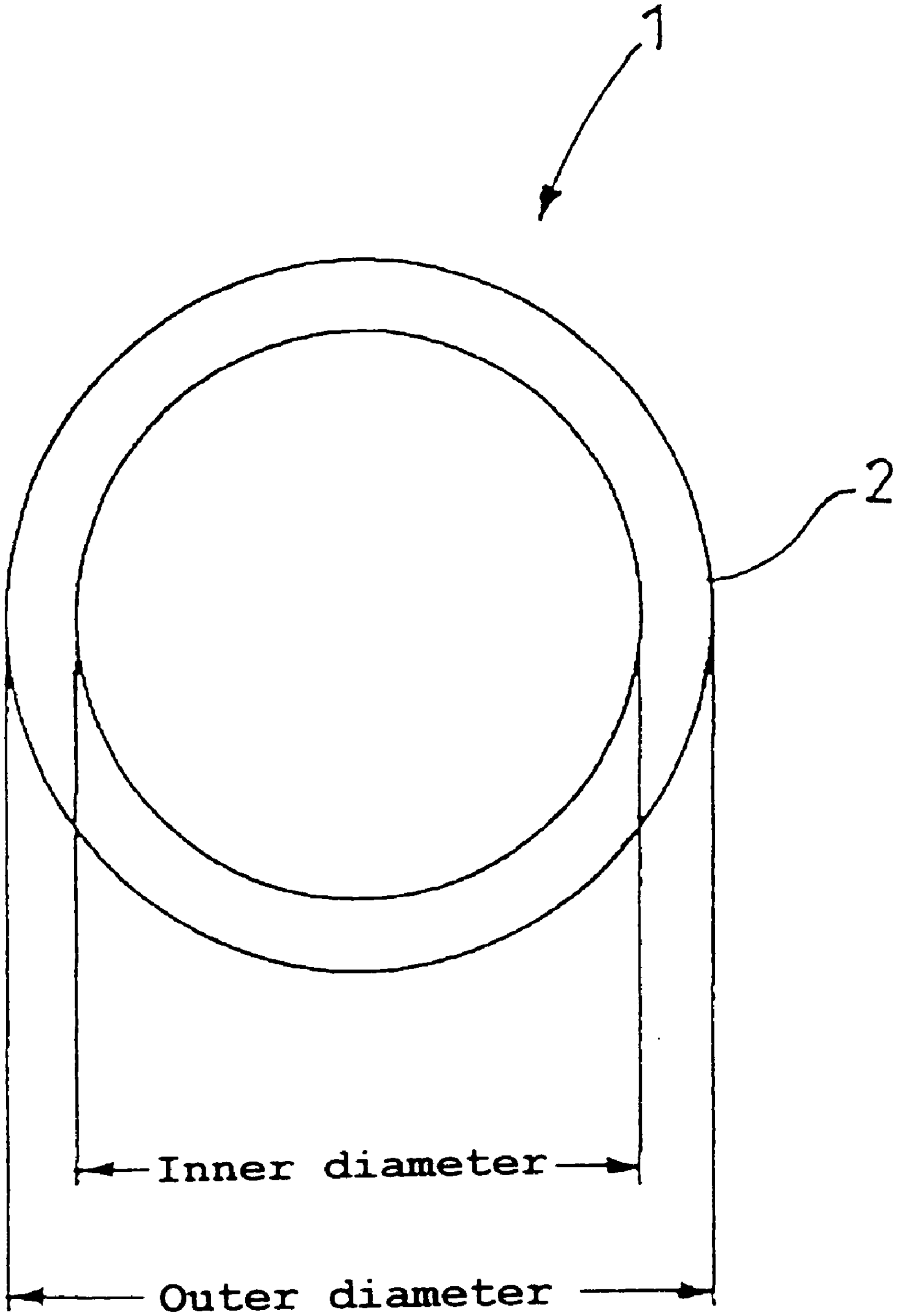
FIG. 1 is a schematic view of each individual particle used in the present invention.
Figure 2:
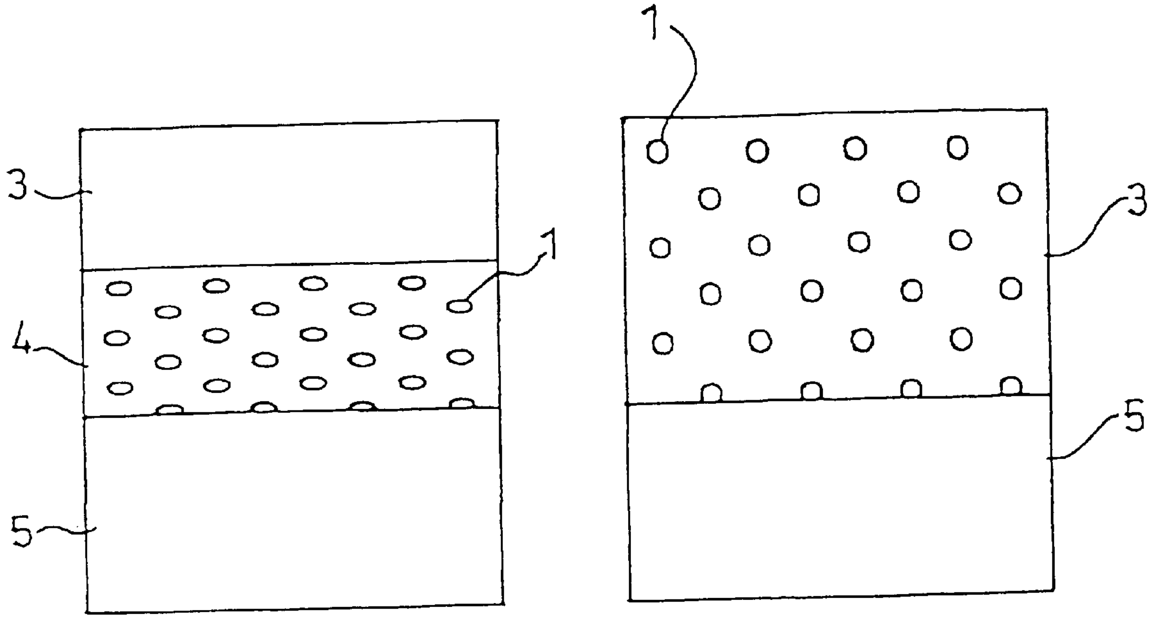
FIG. 2 is sectional views showing the constitution of heat-sensitive lithographic printing plates according to the present invention.
Figure 3:
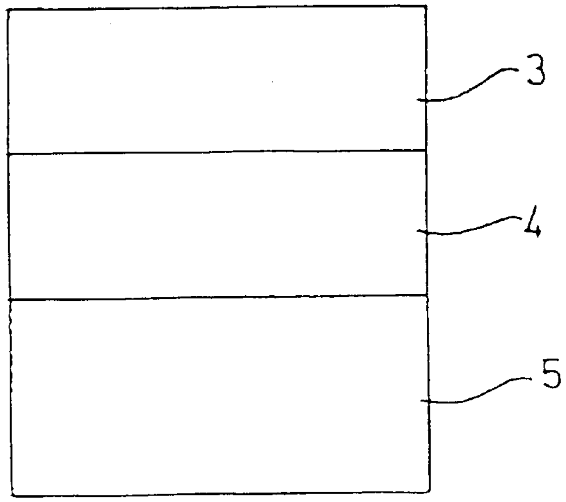
FIG. 3 is a sectional view showing the constitution of a conventional heat-sensitive lithographic printing plate.
Figure 4:
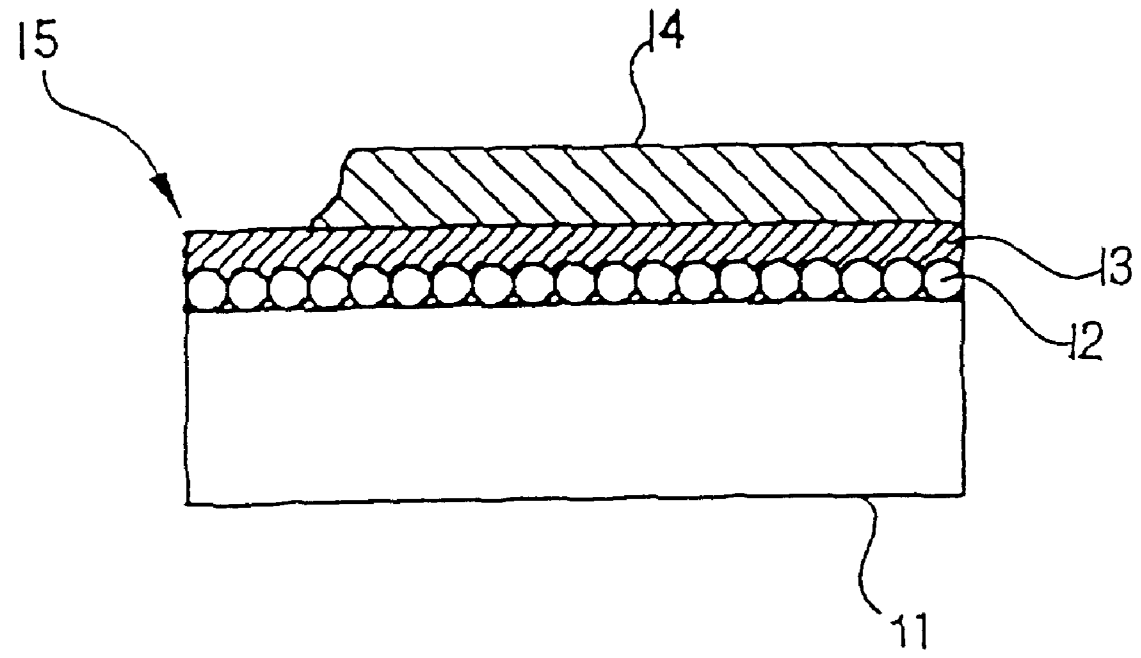
FIG. 4 is a cross-sectional view showing an example of layer structure of a substrate according to the present invention and a heat-sensitive lithographic printing plate using such a substrate.

The reference numerals used in these figures mean the following constituent elements respectively:

1. Hollow microsphere

2. Shell (outer wall)

3. Heat-sensitive layer (image-forming layer)

4. Undercoat layer

5. Support

11. Aluminum support

12. Hollow microsphere

13. Hydrate or oxide layer

14. Image-forming layer (heat-sensitive layer)

15. Substrate for lithographic printing plate

DETAILED DESCRIPTION OF THE INVENTION

The constituent elements of substrates for lithographic printing plates according to the present invention are described below in detail.

[Hollow Microspheres]

Firstly, hollow microspheres as the most striking characteristic of the present invention are illustrated.

The silica-type inorganic fine particles referred to as "Shirasuballoon" are developed as inorganic hollow microspheres by Kyushu Kogyo Shikenjo (Kyushu Industrial Laboratory).

Shirasuballoon is prepared by burning and inflating vitreous pyroclastic material referred to as "Shirasu" in the South Kyushu district, and the main component thereof is aluminosilicate glass. These hollow microspheres are usually several decades μm in size. Lately, Sodeyama et al. have succeeded in production of hollow particles having an average particle size of 10 μm or below. These particles are utilized as lightweight aggregate for cement, filler of paint and lightweight fireproof building material, and are commercially available as products of Silakkusu, Sanki Kako Kenki, Showa Kogyo and Seishin Sangyo.

Further, there are reports that the hollow particles having similar sizes to the above were able to be prepared from titanium dioxide as well as silica substances. For instance, JP-A-10-236818 discloses that very minute hollow particles measuring 1 to 10 nm in size can be obtained by quickly mixing a silicon compound solution and an aluminum compound solution, removing salts formed as by-products, and then subjecting the mixture to hydrothermal synthesis. In addition, hollow zinc oxide particles of the order of 0.05 to 0.1 μm in size are disclosed in JP-A-7-328421.

On the other hand, the detailed description of organic hollow particles can be found in *Zairyo Gijutu* (Technology of Materials), vol. 11, No. 3 (1993). In the present invention, no particular restrictions are imposed on the preparation method for those particles, but well-known methods including emulsion polymerization and suspension polymerization of gas-foaming type can be generally adopted. Organic hollow particles commercially produced by, e.g., Dai-Nippon Ink, Mitsui Toatu, Japanese Zeon and JSR are usable in the present invention. These organic hollow particles are used, e.g., for organic pigment in coated paper, for weight reduction of resins and as a milky turbidity-imparting agent. Further, there is known a technique of controlling diffusion of the heat from a thermal head in heat-sensitive paper for a thermal printer by providing an interlayer of organic hollow particles between the base paper and the heat-sensitive agent layer to impart heat insulating properties to the heat-sensitive printing paper.

The heat-sensitive lithographic printing plates of the present invention are built on premises that polymer hollow microspheres are mixed in an organic solvent-diluted coating composition for an undercoat layer or a heat-sensitive layer (image-forming layer) and coated on a support to form a film. Therefore, it is desirable for the polymer constituting a particle shell to have excellent solvent resistance. Further, the hollow particles are partially heated at the time of irradiation of laser beams, and so their contribution to heat insulating effect cannot be made if they are fused by the exposure. Thus, high resistance to heat is also required for the hollow particles. In order to satisfy these two requirements, it is advantageous for the polymer constituting the shell (outer wall) of each individual particle to have a high cross-linking degree. Although the cross-linking degree of the shell cannot be defined explicitly, the heat resistance can be regarded as a measure of a cross-linking degree and it is thought that the foregoing requirements can be nearly satisfied so long as the thermal decomposition temperature of the shell is not lower than 300° C.

The suitable ratio of the inside diameter to the outside diameter in each of polymer hollow microspheres used in the heat-sensitive lithographic printing plates of the present invention is from 50 to 99%.

When the ratio is lower than 50%, such a void cannot produce a sufficient heat-insulating effect; while when it is higher than 99% the strength as the particle itself is hard to maintain, and so the particles are broken to result in extinction of voids.

The particle diameters of polymer hollow microspheres used in the heat-sensitive lithographic printing plates of the present invention are from 0.01 to 50 μm, preferably from 0.1 to 5 μm, particularly preferably from 0.1 to 1 μm.

Polymer particles having no voids on the inside (such as polystyrene latex, silicone resin or micro gel) are low in thermal conductivity, compared with metallic aluminum, and are somewhat effective in controlling thermal diffusion. However, the effect of hollow particles having a gas phase on the inside is much more remarkable, and the present invention is distinguished by hollowness of the particles used.

[Undercoat Layer]

Secondly is described an undercoat layer provided between a support and a heat-sensitive layer, which are described hereinafter, in the heat-sensitive lithographic printing plate of the present invention containing hollow microspheres as mentioned above.

The layer containing hollow microspheres may be a heat-sensitive layer containing in itself a light-to-heat converting material (image-forming layer). In this case, the hollow microspheres can exert their effect without any problems by addition to the heat-sensitive layer as mentioned hereinafter.

When the undercoat layer is provided as an independent layer, it is preferable that the coating thickness thereof be as thin as possible, but at any rate the coverage of the order of 0.2 $g/m^2$ is required for uniformly spreading hollow particles over the support surface. While the heat-insulating effect is elevated with an increase in the coverage, heat fails to reach into the lower part of the coating film and thereby a trouble of leaving a residue of the coating film is caused. Therefore, the maximum coverage is of the order of 0.5 $g/m^2$. When the plate is a positive-working type, the resins suitably used for binding hollow particles are aqueous alkali-soluble resins having phenolic hydroxyl groups, such as novolak resins.

Then, a method for providing such an undercoat layer as to contain fine particles having voids on the inside, namely hollow microspheres, on an aluminum metal or aluminum alloy sheet (the term "sheet" means a sheet including a plate) as a support is described below.

The simplest method comprises dispersing hollow microspheres into water or a solvent, coating the dispersion by the use of a spin coating or bar coating technique and drying the coated dispersion. To the dispersion, a water-soluble binder resin, such as polyvinyl alcohol (PVA), may be added for the purpose of bonding hollow microspheres to the support surface. However, it is preferable that the water-soluble resin concentration in the dispersion be 0.5% or less. When the water-soluble resin concentration is increased beyond 0.5%, the substrate surface is covered with the resin to cause a decrease in the speed of hydration or oxidation treatment of aluminum. These treatments are described later.

[Heat-Sensitive Layer]

A heat-sensitive layer (image forming layer) that is provided on the substrate to form the heat-sensitive lithographic printing plate of the present invention is described below.

The present invention can have particularly striking effect on compositions capable of forming images by the action of heat. The heat-sensitive layer can be formed using a composition selected properly from conventional compositions. For instance, the compositions disclosed in JP-A-9-222737, JP-A-9-90610, JP-A-9-87245, JP-A-9-43845 and JP-A-7-306528 are usable.

It is a typical example to use aqueous alkali-soluble resins having phenolic hydroxyl groups, such as novolak resins, in positive-working heat-sensitive compositions. More specifically, JP-A-7-285275 discloses the image-forming materials prepared by adding substances capable of absorbing light and thereby evolving heat and various kinds of onium salts or quinonediazide compounds to aqueous alkali-soluble resins having phenolic hydroxyl groups, such as novolak resins. In these image-forming materials, the onium salts or the quinonediazide compounds function as agents for inhibiting the aqueous alkali-soluble resins from dissolving in image areas, while in non-image areas they are decomposed by heat to lose their dissolution-inhibiting function and enable the removal by development. Thus, images are formed therein. From the viewpoint of inhibing the diffusion of heat, hollow microspheres may be dispersed into such a heat-sensitive layer, but when their content is too high, the heat-sensitive layer causes a drop of film strength in the images formed.

As disclosed in U.S. Pat. No. 5,632,204, it is also possible to use as an image-forming layer a metallic thin film capable of undergoing ablation upon infrared absorption. For systems utilizing the image-forming layer of such a type, liquid development is basically unnecessary. Examples of such an image forming layer which can be used for development-free printing plates are disclosed, e.g., in JP-A-11-95421, JP-A-11-84658, JP-A-11-30867, JP-A-11-65106, JP-A-10-282672 and JP-A-10-221842.

For the heat-sensitive lithographic printing plate of the present invention, a protective layer may be provided on the heat-sensitive layer, if desired. Examples of ingredients for the protective layer include polyvinyl alcohol and matting materials for general photosensitive image-forming materials.

Further, a heat-insensitive image-forming layer having a composition as described below may be provided on the undercoat layer containing hollow particles according to the present invention.

As examples of such a heat-insensitive image-forming layer, the image-forming layers which constitute negative-working light-sensitive lithographic printing plates and contain acrylic or urethane resins and diazo resins in combination as disclosed in JP-A-10-20505, JP-A-6-5984, JP-A-8-254825, JP-A-7-281425, JP-A-7-295212 and JP-A-5-197137, the image-forming layers which constitute positive-working light-sensitive lithographic printing plates and contain cresol novolak or phenol resins and diazo compounds in combination as disclosed in JP-A-7-120039, JP-A-7-120040, JP-A-7-120041, JP-A-11-65109, JP-A-11-84674, JP-A-10-282645and JP-A-8-146596, and the photopolymer-utilized image formation layer of negative photo polymerization type as disclosed in JP-A-8-320551, JP-A-10-237118, JP-A-10-161317, JP-A-10-282679, JP-A-11-65109, JP-A-10-282682 and JP-A-10-161317 are exemplified.

When the light-sensitive layers as described above form image areas, it is preferable that the support surface become non-image areas. In this case, it is desirable that the binder of the hollow particles-containing undercoat layer be a water-soluble or water-receptive binder.

[Aluminum Hydrate and Oxide Layer]

On the undercoat layer (first layer), a layer of aluminum hydrate or oxide is formed.

There are known various methods for forming aluminum hydrate or oxide on the surface of an aluminum sheet. Among them, methods for forming chemical films can be employed. For instance, the boehmite process can be used as a method for forming a hydrated oxide film. Therein, the hydrated oxide film of pseudo-boehmite formation is formed by the reaction of aluminum with high-temperature water. More specifically, the demineralized water heated to 90° C. to 100° C. is adjusted to pH 7–12, and therein an aluminum sheet is immersed. For enhancing corrosion resistance of the thus formed film, pressurized vapor treatment is carried out as after-treatment.

In addition, lithium salt-silicate treatment, lime-coating treatment, treatment with an alkali bath containing lime-coating $LiNO_3$, and "saltwater boehmite" treatment using a bath comprising $Mg^{2+}$, $HCO_3^-$ and $SO_4^{2-}$ are proposed as treatments for imparting high corrosion resistance.

As a method for providing an aluminum oxide film, treatment with an alkali salt of chromic acid is usable. More specifically, the MBV method using a bath comprising $Na_2CO_3$ and $NaCrO_2$ and the EW method using a water glass-added bath are known. The conversion coatings as mentioned above involve volumetric expansion since they are formed by the hydration or oxidation of aluminum. However, even when the hollow particles are present on an aluminum sheet, it can be observed that a coating having a special shape grows through gaps among the particles without excluding them from the aluminum surface. As a result, the coating formed comes in such a form as to cover up the particles and enables efficient fixation of the particles to the aluminum surface.

Anodic oxidation treatment for an aluminum support as mentioned hereinafter maybe carried out after the aforementioned hydrate or oxide formation. Such a treatment can be effected under the same conditions as usual. In addition, when the hydrate or oxide is well combined with certain electrolytes, the surface shape-smoothening effect can be expected, too.

Although a substrate for a lithographic printing plate substrate according to the present invention can be prepared by providing on an aluminum support a layer containing hollow microspheres and further thereon a layer of aluminum hydrate or oxide, the substrate may undergo a treatment for imparting water-receptivity thereto, if desired. For such a treatment, the methods of using alkali metal silicates (e.g., an aqueous solution of sodium silicate) as disclosed in U.S. Pat. Nos. 2,714,066, 3,181,461, 3,280,734 and 3,902,734 can be adopted. According to these methods, the support undergoes immersion or electrolysis treatment, e.g., in an aqueous solution of sodium silicate. In addition, the method of treating an aluminum support with potassium fluorozirconate as disclosed in JP-A-36-22063 and the methods comprising a treatment with polyvinylphosphonic acid as disclosed in U.S. Pat. Nos. 3,276,868, 4,153,461 and 4,689, 272 can be adopted. Further, the back of the support may be coated with a backing layer, if needed. Suitable examples of such a backing layer include the coating of organic high molecular compound disclosed in JP-A-5-45885 and the coatings of metal oxides produced by hydrolysis and polycondensation of organometallic or inorganic metal compounds as disclosed in JP-A-6-35174. Of these coatings, the coatings of metal oxides produced from alkoxy compounds of silicon, such as $Si(OCH_3)_4$, $Si(OC_2H_5)_4$, $Si(OC_3H_7)_4$ and $Si(OC_4H_9)_4$, are preferred in particular because such compounds are available at low prices and the coatings formed therefrom are high in water-receptivity.

[Support]

Supports usable for the heat-sensitive lithographic printing plate of the present invention are described below.

The support (i.e., substrate) coated with the aforementioned image-forming layer as a constituent of the heat-sensitive lithographic printing plate of the present invention is a dimensionally stable sheet material, and can include sheet materials hitherto used for printing plates. Suitable examples of such a support include paper, papers laminated with plastics (such as polyethylene, polypropylene and polystyrene), sheets of metals (such as aluminum (including aluminum alloys), zinc, iron and copper), films of plastics (such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal), and papers and plastic films on which the metals as described above are laminated or vapor-deposited. Of these support materials, aluminum is advantageous over the others. This is because a rough surface (grained surface) formed on aluminum by electrochemical treatment enables the aluminum to make a close contact with a layer to be provided thereon, and besides, aluminum can form a porous $Al_2O_3$ layer having very high water-receptivity by carrying out electrochemical anodic oxidation treatment. Therefore, such a surface has very high capability as non-image areas of a printing plate. Thus, aluminum is preferred in particular as a support for lithographic printing plate.

Further, in setting a lithographic printing plate into an image-forming apparatus or a printing press, it is advantageous for the printing plate to have a substrate using an aluminum sheet, because the aluminum sheet is flexible enough to faithfully fit on the surface of a cylinder installed therein and has stiffness of such an order as to resist being folded and bent at the time of handling. In addition, an aluminum sheet is highly stable dimensionally and comparatively cheap. In order to acquire the aforementioned qualities, the aluminum sheet surface is treated by the process described below.

The aluminum sheets usable in the present invention include a pure aluminum sheet and aluminum alloy sheets. These aluminum alloy sheets contain aluminum as a main component and very small amounts of foreign elements. Examples of foreign elements contained in the aluminum alloys include silicon, iron, manganese, copper, magnesium, chromium, zinc, bismuth, nickel, and titanium. The proportion of foreign elements in the alloy is 10% by weight or less. Although the pure aluminum sheet is most advantageous in the present invention, the production of perfectly pure aluminum is difficult in view of the present refining techniques. Such a being case, the aluminum sheet may contain trace amounts of foreign elements. Thus, the aluminum sheet applicable to the present invention has no particular restriction as to the composition, but it can be selected properly from well-known conventional aluminum sheets. The suitable thickness of the aluminum sheet used in the present invention is from about 0.1 mm to about 0.6 mm, preferably from 0.15 mm to 0.4 mm, particularly preferably from 0.2 mm to 0.3 mm.

Prior to the graining treatment, the aluminum sheet may undergo a degreasing treatment with a surfactant, an organic solvent or an alkaline aqueous solution for removing a rolling oil from the sheet surface, if desired The graining treatment for an aluminum sheet surface can be carried out by various methods as disclosed in JP-A-56-28893. For instance, methods of graining mechanically, methods of graining the sheet surface by electrochemical dissolution and methods of graining the sheet surface chemically by selective dissolution can be adopted effectively. Examples of a mechanical graining method include well-known ball abrasion, brush abrasion and blast abrasion methods. As to the electrochemical method, there is a method of graining the sheet surface by passing alternating or direct current through an acidic electrolyte, such as hydrochloric acid or nitric acid opted. Also, mechanical and electrochemical graining methods can be used in combination as disclosed in JP-A-54-63902.

The thus grained aluminum sheet is subjected to alkali-etching treatment and neutralization treatment, if needed. Thereafter, the aluminum sheet is subjected to anodic oxidation treatment if further increase in water-receptivity and abrasion resistance is desired for the sheet. Electrolytes usable for the anodic oxidation treatment of the aluminum sheet are various electrolytes capable forming porous oxide films, and sulfuric acid, phosphoric acid, oxalic acid, chromic acid or a mixed acid thereof is generally used therefor. The suitable electrolyte concentration can be determined properly depending on the species of the electrolyte used. The conditions for anodic oxidation treatment change variously depending on the electrolyte used, so they cannot be generalized. In general, however, it is preferable that the electrolyte concentration be from 1 to 80 weight %, the electrolyte temperature be from 5 to 70° C., the current density be from 5 to 60 ampere/$dm^2$, the voltage be from 1 to 100V and the electrolysis time be from 10 seconds to 5 minutes. When the quantity of the anodially oxidized film is smaller than 1.0 g/$m^2$, sufficient press life cannot be attained, and the image-forming material obtained are liable to be scratched in the non-image areas. As a result, the so-called scratch stains, or adhesion of ink to scratched areas, tend to generate during the printing operation.

After the anodic oxidation treatment, the aluminum sheet surface is subjected to water-receptivity providing treatment, if needed. As a suitable method for such a treatment, there is the alkali metal silicate methods (e.g., using a water solution of sodium silicate) as disclosed in U.S. Pat. Nos. 2,714,066, 3,181,461, 3,280,734 and 3,902,734. In these methods, the support undergoes immersion or electrolytic treatment, in e.g., a water solution of sodium silicate. In addition, the method of treatment with potassium fluorozirconate as disclosed in JP-A-36-22063 and the methods of treatment with polyvinyl phosphonates as disclosed in U.S. Pat. Nos. 3,276,898, 4,153,461 and 4,689,272 are usable.

Further, the back of the support is provided with a backing coat, if needed. Suitable examples of such a backing coat include the coating of organic high molecular compound disclosed in JP-A-5-45885 and the coatings of metal oxides produced by hydrolysis and polycondensation of organometallic or inorganic metal compounds as disclosed in JP-A-6-35174. Of these coatings, the coatings of metal oxides produced from alkoxy compounds of silicon, such as $Si(OCH_3)_4$, $Si(OC_2H_5)_4$, $Si(OC_3H_7)_4$ and $Si(OC_4H_9)_4$, are preferred in particular because such compounds are available at low prices and the coatings formed therefrom are high in water-receptivity.

The heat-sensitive lithographic printing plate of the present invention produced by combining the constituents as mentioned above, inclusive of an undercoat layer (a layer containing hollow particles), a heat-sensitive layer (an image-forming layer) and a support, undergoes imagewise thermal recording directly by the use of a thermal recording head, or imagewise exposure by means of a solid or semiconductor laser device emitting infrared rays of wavelengths of 760 to 1200 nm, a flashlight of high illumination intensity such as a xenon discharge lamp, or an infrared lamp. When the printing plate has a processing-free heat-sensitive layer, such as a metallic thin film, it can be subjected to printing operations directly after exposure without undergoing any further processing.

In the cases of writing or drawing images, the images may be drawn using either area exposure or scanning method. The area exposure method is a method of irradiating the printing plate precursor with infrared rays or high illumination intensity flashlight, such as a xenon discharge lamp, and generating heat by light-to-heat conversion. When an area exposure light source such as an infrared lamp is used, the preferable exposure, though it varies with the illumination intensity, is generally within the range of 0.1 to 10 J/cm$^2$, preferably 0.1 to 1 J/cm$^2$ in terms of the area exposure intensity before modification with images for printing. When the substrate used is transparent, the exposure operation can also be carried out from the rear side of the substrate via the substrate. It is desirable to choose such illumination intensity that the foregoing exposure intensity can be achieved by the exposure time of from 0.01 to 1 msec, preferably 0.01 to 0.1 msec. When the irradiation time is long, it is required to increase the exposure intensity because the thermal energy production speed has a competitive relation to the diffusion speed of the thermal energy produced.

In the scanning exposure, the light source capable of generating infrared-rich laser beams is employed, and the images are drawn by scanning the printing plate precursor with the laser beams modulated by image information. Examples of a laser beam source usable therein include a semiconductor laser, a He—Ne laser, a He—Cd laser and a YAG laser. The suitable output of laser for the scanning exposure is from 0.1 to 300 W. When the exposure is carried out with a pulse laser, however, it is effective that the laser has the peak output of at least 1,000 W, preferably 2,000 W. The suitable exposure in these laser-scanning cases is from 0.1 to 10 J/cm$^2$, preferably 0.3 to 1 J/cm$^2$ in terms of the areal exposure intensity before modulation with images for printing. When the support is transparent, the exposure operation can also be carried out from the rear side of the substrate via the substrate.

When the heat-sensitive layer (image-forming layer) requires development, it is developed with an aqueous alkali agent after thermal recording or irradiation of laser . The aqueous alkali agents which can be used are aqueous alkali solutions well-known as developers and replenishers for heat-sensitive lithographic printing plates. Examples of an alkali agent usable therein include inorganic alkali salts, such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogen carbonate, potassium hydrogen carbonate, ammonium hydrogen carbonate, sodium borate, potassium borate, ammonium borate, sodium hydroxide, ammonium hydroxide, potassium hydroxide and lithium hydroxide. Also, organic alkali agents can be used therein, and examples thereof include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanol-amine, monoisopropanolamine, diisopropanolamine, ethyleneimine, ethylenediimine and pyridine. These alkali agents are used independently or in combination of two or more thereof. Of the developers containing those alkali agents, aqueous solutions of silicates, such as sodium silicate and potassium silicate, are preferred in particular. This is because the developability can be controlled by the ratio between the components of silicate, silicon oxide ($SiO_2$) and alkali metal oxide ($M_2O$), and the silicate concentration, and the alkali metal silicates as disclosed in JP-A-54-62004 and JP-B-57-7427 (the term "JP-B" as used herein means an "examined Japanese patent publication") can be used effectively.

When the development is carried out using an automatic processor, it is known to add to a developer an aqueous solution having higher alkalinity (replenisher) than the developer. By doing so, the processing of a good many PS plates can be continued for many hours without replacing the developer in the tank. In the present invention also, such a replenishing method can be used to advantage. For the purposes of accelerating or retarding the development, dispersing developer scum and enhancing the affinity for ink in the image areas of printing plates processed, various surfactants and organic solvents can be added to the developer and the replenisher, if desired. The surfactants suitably used for those purposes include anionic, cationic, nonionic and amphoteric surfactants. Further, reducing agents, such as hydroquinone, resorcinol, sulfurous acid, and sodium and potassium salts of inorganic acids such as hydrosulfurous acid, and organic carboxylic acid, an antifoaming agent and a water softener can be added to the developer and the replenisher, if needed.

In general the printing plates processed with the developer and the replenisher undergo after-treatments with washing water, a rinsing solution containing, e.g., a surfactant, and a desensitizing solution containing gum arabic or a starch derivative. In the after-treatment for the heat-sensitive lithographic printing plate of the present invention, various combinations of the after-treatments mentioned above can be employed.

In the recent platemaking and printing industry, automatic processors for platemaking have been widely used for the purpose of rationalizing and standardizing platemaking operations. Such an automatic processor generally has a development part and an after-treatment part, and comprises a printing plate-carrying device, tanks for processing solutions and spraying devices. While an exposed printing plate is carried in a horizontal direction by the carrying device, the processing solutions pumped up are sequentially sprayed from their respective spraying nozzles onto the printing plate to effect the processing.

Further, there has been lately known an immersion processing method that an exposed printing plate is made to travel through processing solutions by means of guide rolls or the like installed in processing tanks filled with the processing solutions respectively. In such an automatic system, the processing can be continued while replenishers are fed to their respective processing solutions in amounts depending on processing throughput and hours of operation. Also, the method of throwing away processing solutions after use, or the method of processing with solutions in a practically unused state, is usable in the present invention.

When image-forming materials requiring development are used for light-sensitive lithographic printing plates, the lithographic printing plates are made by undergoing image-wise exposure, development, washing and/or rinsing and/or gumming, coated with a desensitizing gum, if desired, and then mounted in a printing machine (i.e., a printing press), followed by printing operations. On the other hand, when no development is required for the image-forming materials used, the heat-sensitive printing plate made by thermal recording or laser irradiation may be mounted immediately in a printing machine, but it is advantageous that the printing plate is subjected to heating treatment after the thermal recording or laser irradiation.

The present invention will now be illustrated in more detail by reference to the following examples, but these examples should not be construed as limiting the scope of the present invention in any way.

EXAMPLE I

[Method of Forming Layer Containing Hollow Particles]

A composition for forming an undercoat layer was prepared according to the formulation described below. The hollow particles used therein were polymer fine particles, powder-type SX866 (trade name, produced by JSR Co., Ltd.). These particles were white fine powder made from cross-linked styrene-acrylic copolymer, and they had a primary particle diameter of 0.3 μm and an inside diameter of 0.2 μm. The composition thus prepared was coated to form an layer (i.e., an undercoating layer) containing hollow particles.

When a light-to-heat converting material was contained, carbon black was added to the composition in a given amount.

In comparative cases, non-hollow particles, specifically the polystyrene latex (average particle diameter: 0.23 μm) produced by Dow Chemical Co., were added to the composition in place of the hollow particles in the same proportion, and formed an undercoat layer.

| Hollow Particles-Containing Composition for Undercoat Layer: | |
|---|---|
| Suspension of hollow particles (prepared by dispersing 1 g of hollow particles, SX866(A) produced by JSR Co., in 5 g of 1-methoxy-2-propanol) | 1.0 g |
| (Phenol/p-cresol) -aldehyde resin (average molecular weight: 8,000; phenol/p-cresol ratio: 5/5 by mole; unreacted p-cresol content: 0.7%) | 2.50 g |
| Methyl ethyl ketone | 55 g |
| (Carbon black) | (10 g) |

[Preparation of Supports]

(Aluminum Support)

The surface of a 0.24 mm-thick aluminum sheet (quality: 1050) was grained using a nylon brush and a 400-mesh pumice stone-water suspension, and washed thoroughly with water. This sheet was immersed in a 10 weight % sodium hydroxide solution for 60 seconds at 70° C. to effect etching, washed with running water, rinsed with a 20 weight % aqueous $HNO_3$ solution for neutralization and further washed with water. Then, the thus etched sheet was subjected to electrolytic surface-roughening treatment. Therein, a 1 weight % aqueous solution of nitric acid was used as an electrolyte and an alternating current of sine wave form was applied under a condition of $V_A$=12.7 V so that the quantity of electricity at the anode was 200 Coulomb/$dm^2$. The surface roughness of the thus treated aluminum sheet was found to be 0.55 um (expressed in terms of Ra defined in JIS B0601). Then, the aluminum sheet was desmutted by 2 minutes immersion in a 30 weight % aqueous $H_wSO_4$ solution heated to 50° C. Further, the resulting aluminum sheet was anodized in a 20 weight % aqueous $H_sSO_4$ solution under a current density of 14 A/$dm^2$ till the anodic coating had a coverage of 2.5 g/$m^2$, and then washed with water to produce a Support A. This support had a surface roughness Ra (JIS B 0601) of 0.52 μm.

(PET Support)

A commercially available polyethylene terephthalate film (thickness: 0.5 mm) was employed as Support B.

[Preparation of Heat-Sensitive Layers (Image-Forming Layers)]

Three kinds of compositions described below were prepared for image-forming layers (heat-sensitive layers), and coated on or vapor-deposited onto a substrate surface as they were or after the hollow particles are added thereto, thereby forming heat-sensitive layers A, B and C.

(Coating Composition for Heat-Sensitive Layer A)

| | |
|---|---|
| Capric acid | 0.03 g |
| Specified copolymer (Resin having phenolic hydroxyl groups, more specifically a copolymer containing as a copolymerizing component at least one of sulfonamido group-containing monomer and an active imino group-containing monomer in a amount of at least 10 mole %, obtained by the polymerization method as mentioned below) | 0.75 g |
| m,p-Cresol novolak | 0.25 g |
| Cyanine dye | 0.017 g |
| p-Toluenesulfonic acid | 0.003 g |
| Tetrahydrophthalic anhydride | 0.03 g |
| Victoria Pure Blue (dye obtained by substituting 1-naphthalenesulfonic acid anion for the counter anion of BOH) | 0.017 g |
| Fluorine-containing surfactant (Magafac F-177, produced by Dai-Nippon Ink & Chemicals, Inc.) | 0.05 g |
| γ-Butyrolactone | 10 g |
| Methyl ethyl ketone | 10 g |
| 1-Methoxy-2-propanol | 1 g |

(Preparation Example of Copolymer Mentioned Above)

In a 500 ml three-necked flask equipped with a stirrer, a condenser and a dropping funnel, 31.0 g (0.36 mole) of methacrylic acid, 39.1 g (0.36 mole) of ethyl chloroformate and 200 ml of acetonitrile were placed, and stirred while cooling in an ice-cold water bath. To this mixture, 36.4 g (0.36 mole) of triethylamine was added dropwise from the dropping funnel over a period of about one hour At the conclusion of dropwise addition, the ice-cold water bath was removed, and the resulting mixture was stirred for 80 minutes at room temperature.

To this reaction mixture, 51.7 g (0.30 mole) of p-aminobenzenesulfonamide was further added, and stirred for one hour while heating to 70° C. with an oil bath. After the completion of the reaction, the reaction mixture was poured into water while agitating the water. The agitation was continued for 30 minutes. Then, the precipitate was taken out from the mixture by filtration, and made into slurry by the use of 500 ml of water. This slurry was filtered, and the solid obtained was dried. Thus, N-(p-aminosulfonylphenyl)methacrylamide was obtained as a white solid (yield: 46.9 g).

Then, 5.04 g (0.0210 mole) of N-(p-aminosulfonylphenyl)methacrylamide, 2.05 g (0.0180 mole) of ethyl methacrylate, 1.11 g (0.021 mole) of acrylonitrile and 20 g of N,N-dimethylacetamide were placed in a 100 ml three-necked flask equipped with a stirrer, a condenser and a dropping funnel, and stirred while heating to 65° C. with a hot water bath. To this mixture was added 0.15 g of V-65 (trade name, a product of Wako Pure Chemical Industries, Ltd.), and the resulting mixture was stirred for 2 hours in a stream of nitrogen while the temperature thereof was kept at 65° C. Thereto, a mixture of 5.04 g of N-(p-aminosulfonylphenyl)methacryl-amide, 2.05 g of ethyl methacrylate, 1.11 g of acrylonitrile, 20 g of N,N-dimethylacetamide and 0.15 g of V-65 was added dropwise from the dropping funnel over a 2-hour period. After the addition was finished, the mixture was further stirred for 2 hours at 65° C. At the conclusion of the reaction, 40 g of methanol was added to the reaction mixture, cooled, and poured into 2 liter of water while agitating the water. After stirring the mixture for 30 minutes, the precipitate was taken out by filtration, and dried to give 15 g of a white solid. The copolymer thus produced was examined for molecular weight by gel permeation chromatography, and found to have a weight average molecular weight of 53,000 (on a polystyrene basis).

(Coating Composition for Heat-Sensitive Layer B)

| | |
|---|---|
| Carbon black dispersion | 10 g |
| Hexafluorophosphate of 4-diazodiphenyl amine-formaldehyde condensate | 0.5 g |
| Radical copolymer of methacrylic acid, 2-hydroxyethylacrylate, benzylmethacrylate and acrylonitrile (15:30:40:15 by mole; weight average molecular weight: $1.0 \times 10^5$) | 5 g |
| Malic acid | 0.05 g |
| FC-430 (fluorine-containing surfactant, a product of U.S. 3M Co.) | 0.05 g |
| 1-Methoxy-2-propanol | 80 g |
| Ethyl lactate | 15 g |
| Water | 5 g |

(Heat-Sensitive Layer C: Vapor-Deposion Condition of Ti)

Pure metal of Ti (99.8%, 0.5 mmϕ, a product of Nilaco) was heated and vapor-deposited in a vacuum deposition apparatus made by Japan Electron Optics Laboratory Co., Ltd., and deposited in a thickness of 1,000 angstrom on a substrate.

EXAMPLES I-1 TO I-9 AND COMPARATIVE EXAMPLES I-1 TO I-8

The supports (substrates), the undercoat layers and the heat-sensitive layers A, B and C prepared in Example I were combined as shown in Table I-1 to produce heat-sensitive printing plates as examples and comparative examples.

TABLE I-1

| | | Undercoat Layer | | | Heat-sensitive Layer | | |
|---|---|---|---|---|---|---|---|
| | Support | Binder | Particles | Light-to-heat converting agent | Kind | Particles | Note |
| Example I-1 | Al | not added | not added | not added | A | added | Hollow particles (SX866) |
| Example I-2 | Al | Added | not added | not added | A | added | Hollow particles (SX866) |
| Example I-3 | Al | Added | not added | not added | B | added | Hollow particles (SX866) |
| Example I-4 | Al | Added | added | not added | A | not added | Hollow particles (SX866) |
| Example I-5 | Al | Added | added | not added | B | not added | Hollow particles (SX866) |
| Example I-6 | Al | Added | added | not added | C | not added | Hollow particles (SX866) |
| Example I-7 | Al | Added | added | added | A | not added | Hollow particles (SX866) |
| Example I-8 | Al | Added | added | added | A | added | Hollow particles (SX866) |
| Example I-9 | PET | Added | added | not added | C | not added | Hollow particles (SX866) |
| Compar. Example I-1 | Al | Added | not | not added added | A | not | added |
| Compar. Example I-2 | Al | Added | not added | not added | B | not added | |
| Compar. Example I-3 | Al | Added | added | not added | A | not added | Non-hollow particles* |
| Compar. Example I-4 | Al | Added | added | not added | A | not added | Non-hollow particles** |
| Compar. Example I-5 | Al | Added | not added | not added | A | Added | Non-hollow particles** |
| Compar. Example I-6 | Al | Added | not added | not added | A | Added | Hollow particles*** |
| Compar. Example I-7 | PET | Added | not added | not added | C | Not added | |
| Compar. Example I-8 | Al | Added | not added | not added | C | Not added | |

*: non-crosslinked particles
**: latex
***: Shirasuballoon

<Performance Evaluation of Lithographic Printing Plates>

The heat-sensitive lithographic printing plates produced in Examples I-1 to I-9 and Comparative Examples I-1 to I-8 were evaluated according to the following criteria. The results are shown in Table I-2.

[Cases of Heat-Sensitive Layers A and B]

(Sensitivity)

The lithographic printing plates obtained were each subjected to imagewise exposure at a main scanning speed of 5 m/sec by the use of a semiconductor laser operating at an output of 500 mW, a wavelength of 830 nm and a beam diameter of 17 μm (1/$e^2$). In the case of the heat-sensitive layer B, the exposed plates were heated for 1 minute by means of a 140° C. oven.

Then, the printing plates were each processed by being passed through an automatic processor, PS Processor 900VR (made by Fuji Photo Film Co., Ltd.) loaded with a developer DP-4 (1:8) and a rinsing solution FR-3 (1:7). Both DP-4 and FR-3 are products of Fuji Photo Film Co., Ltd. Additionally, the expression DP-4 (1:8) used herein means a DP-4 solution diluted with water to the concentration of ⅛.

The non-image areas thus formed on each printing plate were examined for line width, and the measured values of line widths were employed as an index to sensitivity.

(Press Life)

The lithographic printing plates produced were each subjected to imagewise exposure using a thermal plate setter, CREO 3244T (trade name, made by CREO CO.), equipped with a 830-nm semiconductor laser, the output of which was adjusted so as to apply a power of 11 mW to the plate surface, under a scanning speed of 75 r.p.m. and 2540 dpi.

The thus exposed printing plates were each developed with DP-4 (1:8), and then mounted in a printing press, Heidel KOR-D (made by Heidelberg A. G.), followed by printing on wood free paper sheets. The printing from each of the printing plates was repeated as the plate surface was wiped with a cleaner solution, Plate Cleaner CL2 (trade name, a product of Fuji Photo Film Co., Ltd.), after every printing of 5,000 sheets.

The final number of the thus printed matters was estimated as the number of printed matters on which the printing was done from each printing plate before the heat-sensitive layer thereof was thinned to cause partial lack of inking, namely the plate had some spots missing (i.e., disappearances).

The values of press life set forth in Table I-2 are on a percentage basis, with the final number of printed matters printed from the printing plate made in Comparative Example I-1 being taken as 100%.

[Case of Heat-Sensitive Image-Forming Layer C]

(Sensitivity)

The lithographic printing plates obtained were each subjected to imagewise exposure using Pearl Setter (a semiconductor laser made by Presstek Co., operating at a power supply of 1.2 W and a wavelength of 908 nm) at a main scanning speed of 2 m/sec. In this case, ablation of Ti was utilized, and so development was not carried out. The non-image areas thus formed on each printing plate were examined for line width, and the measured values of line widths were employed as an index to sensitivity.

The evaluation results of sensitivity and printing performance (staining, press life) in the cases of the heat-sensitive layer A are shown in Table I-2, those in the cases of the heat-sensitive layer B are shown in Table I-3, and those of the heat-sensitive layer C are shown in Table I-4.

TABLE I-2

(Printing Plates provided with Heat-sensitive Layer A)

| | | Evaluation Results | | Press | Particles |
|---|---|---|---|---|---|
| | Support | Sensitivity | Staining | life | added |
| Example I-1 | Al | 15 μm | ○Δ | 100% | SX866 |
| Example I-2 | Al | 15 μm | ○Δ | 100% | SX866 |
| Example I-4 | Al | 16 μm | ○ | 100% | SX866 |
| Example I-7 | Al | 17 μm | ○Δ | 100% | SX866 |
| Example I-8 | Al | 17 μm | ○ | 100% | SX866 |
| Comparative Example I-1 | Al | 10 μm | ○ | 100% | — |
| Comparative Example I-3 | Al | 8 μm | Δ | 100% | Non-hollow particles* |
| Comparative Example I-4 | Al | 12 μm | ○Δ | 100% | Non-hollow particles** |
| Comparative Example I-5 | Al | 11 μm | ○ | 100% | Non-hollow particles** |
| Comparative Example I-6 | Al | 10 μm | ○ | 80% | Hollow particles*** |

The marks *,  and * in Table I-2 have the same meanings as in Table I-1 respectively.

TABLE I-3

(Printing Plates provided with Heat-sensitive Layer B)

| | | Undercoat Layer | | Layer | Heat-sensitive Sensi- | Image |
|---|---|---|---|---|---|---|
| | Support | Binder | Particles | Particles | tivity | formed |
| Example I-3 | Al | added | not added | added | 17 μm | Fair |
| Example I-5 | Al | added | Added | not added | 17 μm | Fair |
| Compar. Example I-2 | Al | added | not added | not added | 15 μm | Fair |

TABLE I-4

(Printing Plates provided with Heat-sensitive Layer C)

| | | Undercoat Layer | | Sensi-tiv | Image |
|---|---|---|---|---|---|
| | Support | Binder | Particles | ity | formed |
| Example I-6 | Al | Added | added | 25 μm | Fair |
| Example I-9 | PET | Added | added | 28 μm | Fair |
| Compar. Example I-7 | PET | Added | not added | 28 μm | Fair |
| Compar. Example I-8 | Al | Added | not added | 14 μm | Fair |

The results shown in Table I-2 clearly show that heat diffusion-inhibitive effects of the hollow particles were produced distinctly in all the Examples of the present invention, and the presence of hollow particles as in the printing plates had the advantage over the presence of non-hollow particles in the printing plates of Comparative Examples I-3 to I-5.

As is apparent from Table I-3, the addition of hollow particles to either the undercoat layer or the heat-sensitive layer as in the examples of the present invention brought about an expansion of the line width, which indicates that the hollow particles inhibit heat diffusion to enhance the sensitivity.

Further, as is apparent from Table I-4 that the sensitivity at the same level as obtained on the PET support was obtained even on the aluminum support susceptible to heat diffusion so long as the hollow particles were added as in the example of the present invention.

As mentioned above, all the heat-sensitive lithographic printing plates produced in the examples of the present invention achieved satisfactory results.

More specifically, in accordance with the present invention, the heat-sensitive lithographic printing plate contains polymer hollow microspheres, each of which is walled with a highly cross-linked polymer film and has a void on the inside, in a heat-sensitive layer (or an image-forming layer) and/or an undercoat layer provided on a support, and thereby the diffusion of heat can be inhibited and the heat generated by light-to-heat conversion can be used effectively for image formation. Therefore, an appreciable saving in laser energy required for image formation can be realized, and a reduction in writing time becomes possible. And at the same time, it becomes possible to use low-powered cheap laser to achieve a reduction in printing system cost.

EXAMPLE II

[Preparation of Supports]

(Aluminum Support: S-1)

The surface of a 0.24 mm-thick aluminum sheet (quality: 1050) was grained using a nylon brush and a 400-mesh purmice stone-water suspension, and washed thoroughly with water. This sheet was immersed in a 10 weight % sodium hydroxide solution for 60 seconds at 70° C. to effect etching, washed with running water, rinsed with a 20 weight % aqueous $HNO_3$ solution for neutralization and further washed with water. Then, the thus etched sheet was subjected to electrolytic surface-roughening treatment. Therein, a 1 weight % aqueous solution of nitric acid was used as an electrolyte and an alternating current of sine wave form was applied under a condition of $V_A$=12.7 V so that the quantity of electricity at the anode was 200 Coulomb/dm$^2$. The surface roughness of the thus treated aluminum sheet was found to be 0.5 5μm(expressed in terms of Ra). Then, the aluminum sheet was desmutted by 2 minutes' immersion in a 30 weight % aqueous $H_2SO_4$ solution heated to 50° C. Further, the resulting aluminum sheet was anodized in a 20 wieght % aqueous $H_2SO_4$ solution under a current density of 14 A/dm$^2$ till the anodic coating had a coverage of 2.5 g/m$^2$, and then washed with water to produce a Support S-1. This support had a surface roughness Ra of 0.52 μm.

(Aluminum Support: S-2)

The same aluminum sheet as used for preparation of Support S-1 was subjected to surface treatments under the same conditions as employed for Support S-1 till the electrolytic surface-roughening treatment was finished, and then desmutted by 2 minutes' immersion in a 30 weight % aqueous $H_2SO_4$ solution heated to 55° C., thereby preparing Support S-2.

(PET Support)

A commercially available polyethylene terephthalate film (thickness: 0.5 mm) was ready for a support, and referred to as Support PET.

[Method of forming Substrate containing Hollow Particles]

(1. Formulation of Layer of Hollow Particles (Undercoat Layer))

As hollow particles, Shirasuballoon or polymer fine particles, powder-type SX866 (trade name, produced by JSR Co., Ltd.) were employed. The average particle size of Shirasuballoon was about 10 μm, the thickness of its outer wall was from 0.5 to 1 μm, and the voidage thereof was from 60 to 70%. The polymer hollow microspheres were white fine powder made from cross-linked styrene-acrylic copolymer, and they had a primary particle diameter of 0.3 μm and an inside diameter of 0.2 μm, and the voidage thereof was 20%. The hollow particles of each type were dispersed into the solution having the following composition to prepare hollow particles-containing undercoat Solution L-1 or L-2.

| | |
|---|---|
| (Hollow particles-containing Undercoat Composition L-1) | |
| Hollow microspheres (Shirasuballoon) | 1.0 g |
| PVA (polyvinyl alcohol) | 1.0 g |
| Methyl ethyl ketone | 10 g |
| Water | 90 g |
| (Hollow particles-containing Undercoat Composition L-2) | |
| Hollow microspheres (Shirasuballoon, SX866(A) produced by JSR Co.) | 1.0 g |
| PVA (polyvinyl alcohol) | 1.0 g |
| Methyl ethyl ketone | 10 g |
| Water | 90 g |

The hollow particles-containing layers were formed by coating the thus prepared undercoat solutions respectively.

In comparative cases, non-hollow particles, specifically the polystyrene latex (average particle diameter: 0.23 μm) produced by Dow Chemical Co., were added to the undercoat solution in place of the hollow particles in the same proportion, and formed into an undercoat layer L-0.

(2. Formulation of Hydrade Layer and Oxide Layer)

An aqueous solution of $LiNO_3$ was adjusted to pH 11.2 with aqueous ammonia, and heated to 45° C. Therein, each support provided with a layer of hollow particles was immersed for 60 seconds, and then washed with water to form a hydrate layer.

In the case of using Support S-2, the support provided with the hydrate layer in the foregoing manner was further anodized in a 20 wieght % aqueous $H_2SO4$ solution under a current density of 14 A/dm$^2$ till the anodic coating had a coverage of 2.5 g/m$^2$, and then washed with water, thereby forming an oxide layer.

[Preparation of Heat-Sensitive Image-Forming Layers]

Two kinds of compositions described below were prepared for image-forming layers (heat-sensitive layers), and coated on or vapor-deposited onto the foregoing lithographic printing plate substrate provided with the layer of hollow particles and the hydrate layer or the oxide layer, thereby forming heat-sensitive layers A and B.

(Coating Composition for Heat-sensitive Layer A)

| | |
|---|---|
| Capric acid | 0.03 g |
| Particular copolymer (See the following) (Resin having phenolic hydroxyl groups, more specifically a copolymer containing as a copolymerizing component at least one of sulfonamido group-containing monomer and an active imino group-containing monomer in an amount of at least 10 mole %) | 0.75 g |
| m,p-Cresol novolak | 0.25 g |
| Cyanine dye | 0.017 g |
| p-Toluenesulfonic acid | 0.003 g |

-continued

| | |
|---|---|
| Tetrahydrophthalic anhydride | 0.03 g |
| Victoria Pure Blue (dye obtained by substituting 1-naphthalenesulfonic acid anion for the counter anion of BOH) | 0.017 g |
| Fluorine-containing surfactant (Magafac F-177, produced by Dai-Nippon Ink & Chemicals, Inc.) | 0.05 g |
| γ-Butyrolactone | 10 g |
| Methyl ethyl ketone | 10 g |
| 1-Methoxy-2-propanol | 1 g |

(Preparation Example of Copolymer Mentioned Above)

In a 500 ml three-necked flask equipped with a stirrer, a condenser and a dropping funnel, 31.0 g (0.36 mole) of methacrylic acid, 39.1 g (0.36 mole) of ethyl chloroformate and 200 ml of acetonitrile were placed, and stirred while cooling in an ice-cold water bath. To this mixture, 36.4 g (0.36 mole) of triethylamine was added dropwise from the dropping funnel over a period of about one hour. At the conclusion of dropwise addition, the ice-cold water bath was removed, and the resulting mixture was stirred for 30 minutes at room temperature.

To this reaction mixture, 51.7 g (0.30 mole) of p-aminobenzenesulfonamide was further added, and stirred for one hour while heating to 70° C. with an oil bath. After the completion of the reaction, the reaction mixture was poured into water while agitating the water. The agitation was continued for 30 minutes. Then, the precipitate was taken out from the mixture by filtration, and made into slurry by the use of 500 ml of water. This slurry was filtered, and the solid obtained was dried. Thus, N-(p-aminosulfonylphenyl)methacrylamide was obtained as a white solid (yield: 46.9 g).

Then, 5.04 g (0.02 10 mole) of N-(p-aminosulfonylphenyl)methacrylamide, 2.05 g (0.0180 mole) of ethyl methacrylate, 1.11 g (0.02 1 mole) of acrylonitrile and 20 g of N,N-dimethylacetamide were placed in a 100 ml three-necked flask equipped with a stirrer, a condenser and a dropping funnel, and stirred while heating to 65° C. with a hot water bath. To this mixture was added 0.15 g of V-65 (trade name, a product of Wako Pure Chemical Industries, Ltd.), and the resulting mixture was stirred for 2 hours in a stream of nitrogen while the temperature thereof was kept at 65° C. Thereto, a mixture of 5.04 g of N-(p-aminosulfonylphenyl)methacrylamide, 2.05 g of ethyl methacrylate, 1.11 g of acrylonitrile, 20 g of N,N-dimethylacetamide and 0.15 g of V-65 was added dropwise from the dropping funnel over a 2-hour period. After the addition was finished, the mixture was further stirred for 2 hours at 65° C.

At the conclusion of the reaction, 40 g of methanol was added to the reaction mixture, cooled, and poured into 2 liter of water while stirring the water. After stirring the mixture for 30 minutes, the precipitate was taken out by filtration, and dried to give 15 g of a white solid. The copolymer thus produced was examined for molecular weight by gel permeation chromatography, and found to have a weight average molecular weight of 53,000 (on a polystyrene basis).

(Heat-Sensitive Layer B: Vapor-Deposition Condition of Ti)

Pure metal of Ti (99.8%, 0.5 mmϕ, a product of Nilaco) was heated and vapor-deposited in a vacuum deposition apparatus made by Japan Electron Optics Laboratory Co., Ltd. and deposited in a thickness of 100nm on a substrate.

EXAMPLES II-1 TO II-5 AND COMPARATIVE EXAMPLES II-1 TO II-7

The supports (Substrates S-1, S-2, PET), the undercoat layers (L-0, L-1, L-2) and the image-forming layers (heat-sensitive layers) A and B prepared in Example II were combined as shown in Table II-1 to produce heat-sensitive printing plates as examples and comparative examples.

<Performance Evaluation of Lithographic Printing Plates>

The heat-sensitive lithographic printing plates produced so as to have the contents set forth in Table II-1 were evaluated according to the following criteria. The evaluation results obtained are shown in Table II-1.

[Cases of Heat-Sensitive Image-Forming Layer A]

(Sensitivity)

The heat-sensitive lithographic printing plates obtained were each subjected to imagewise exposure at a main scanning speed of 5 m/sec by the use of a semiconductor laser operating at an output of 500 mW, a wavelength of 830 nm and a beam diameter of 30 $\mu$m ($1/e^2$).

Then, the printing plates were each processed by being passed through an automatic processor, PS Processor 900VR (made by Fuji Photo Film Co., Ltd.) loaded with a developer DP-4 (1:8) and a rinsing solution FR-3 (1:7). Both DP-4 and FR-3 are products of Fuji Photo Film Co., Ltd. Additionally, the expression DP-4 (1:8) used herein means a DP-4 solution diluted with water to the concentration of ⅛.

The non-image areas thus formed on each printing plate were examined for line width, and the measured values of line widths were employed as an index to sensitivity.

(Staining and Press Life)

The heat-sensitive lithographic printing plates produced were each subjected to imagewise exposure using a thermal plate setter, CREO 3244T (trade name, made by CREO CO.), equipped with a 830-nm semiconductor laser, the output of which was adjusted so as to apply a power of 11 mW to the plate surface, under a scanning speed of 75 r.p.m. and 2540 dpi.

The thus exposed printing plates were each developed with DP-4 (1:8), and then mounted in a printing press, Heidel KOR-D (made by Heidelberg A. G.), followed by printing on woodfree paper sheets. The printing from each of the printing plates was repeated as the plate surface was wiped with-a cleaner solution, Plate Cleaner CL2 (trade name, a product of Fuji Photo Film Co., Ltd.), after every printing of 5,000 sheets.

The final number of the thus printed matters was estimated as the number of printed matters on which the printing was done from each printing plate before the heat-sensitive layer thereof was thinned to cause partial lack of inking, namely the plate had some spots missing (i.e., disappearances). The values of press life set forth in Table II-1 are on a percentage basis, with the final number of printed matters printed from the printing plate made in Comparative Example II-6 being taken as 100%.

[Case of Heat-Sensitive Layer B]

(Sensitivity)

The heat-sensitive lithographic printing plates obtained were each subjected to imagewise exposure using Pearl Setter (a semiconductor laser made by Presstek Co., operating at a power supply of 1.2 W and a wavelength of 908 nm) at a main scanning speed of 2 m/sec. In this case, ablation of Ti was utilized, and so development was not carried out. The non-image areas thus formed on each printing plate were examined for line width, and the measured values of line widths were employed as an index to sensitivity.

TABLE II-1

Evaluation Results of Sensitivity and Printing Performance (Staining, Press Life)

| | Support | Undercoat Layer | Hydrate Treatment | Anodic Oxidation | Image-forming Layer A Sensitivity | Image-forming Layer A Staining | Image-forming Layer A Press Life | Image-forming Layer A Scratch Stains | Image-forming Layer B Sensitivity |
|---|---|---|---|---|---|---|---|---|---|
| Example II-1 | S-1 | L-1 | received | — | 20 μm | ○ | 120% | ◎ | ◎ |
| Compar. Ex. II-1 | S-1 | L-1 | not received | — | 22 μm | ○ | 100% | Δ | ◎ |
| Example II-2 | S-1 | L-2 | received | — | 18 μm | ○ | 120% | ◎ | ◎ |
| Compar. Ex. II-2 | S-1 | L-2 | not received | — | 17 μm | X | 90% | X | ◎ |
| Compar. Ex. II-3 | S-1 | L-0 | received | — | 13 μm | ○ | 120% | ◎ | ○ |
| Compar. Ex. II-4 | S-1 | L-0 | not received | — | 12 μm | X | 100% | X | ○ |
| Compar. Ex. II-5 | S-1 | absent | received | — | 9 μm | ○ | 120% | ◎ | X |
| Compar. Ex. II-6 | S-1 | absent | not received | — | 10 μm | ◎ | 100% | ◎ | X |
| Compar. Ex. II-7 | S-2 | absent | received | Received | 13 μm | ◎ | 120% | ○ | X |
| Example II-3 | S-2 | L-1 | received | Received | 22 μm | ◎ | 120% | ○ | ◎ |
| Example II-4 | S-2 | L-2 | received | Received | 20 μm | ◎ | 120% | ○ | ◎ |
| Example II-5 | S-2 | L-2 | received | not received | 19 μm | ○ | 120% | ◎ | ◎ |

The symbols used in Table II-1 for showing evaluation results of printing performance (staining, scratch stains, sensitivity) mean the following conditions respectively.

◎: very good

○: good

Δ: rather bad

X: very bad

As illustrated above, each of the lithographic printing plate substrates prepared in accordance with the method of the present invention comprises a support having provided thereon a layer of hollow microspheres and further thereon an aluminum hydrate layer or an aluminum oxide layer, and thereby the diffusion of heat can be inhibited and the heat generated by light-to-heat conversion can be used effectively for image formation. Therefore, an appreciable saving in laser energy required for image formation can be realized, and a reduction in writing time becomes possible. And at the same time, it becomes possible to use low-powered cheap laser to achieve a reduction in printing system cost.

What is claimed is:

1. A heat-sensitive lithographic printing plate comprising a support having thereon an undercoat layer and a heat-sensitive layer in this order, at least one of said undercoat layer and said heat-sensitive layer comprising polymer hollow microspheres having voids on the inside wherein the support is an aluminum sheet or an aluminum alloy sheet and the undercoat layer is covered with a filmy layer of aluminum hydrate and/or aluminum oxide.

2. The heat-sensitive lithographic printing plate as in claim 1, wherein the filmy layer of aluminum hydrate is formed by a hydration treatment, and the filmy layer of aluminum oxide is formed by subjecting the filmy layer of aluminum hydroxide to a anodic oxidation treatment.

3. A substrate for a lithographic printing plate comprising an aluminum or aluminum alloy sheet support, further having on the support an undercoat layer comprising hollow microspheres and a filmy layer of aluminum hydrate and/or aluminum oxide in this order.

4. The heat sensitive lithographic printing plate as in claim 3, wherein the filmy layer of aluminum hydrate is formed by a hydration treatment, and the filmy layer of aluminum oxide is formed by subjecting the filmy layer of aluminum hydroxide to an anodic treatment.

5. A method of producing a substrate for a lithographic printing plate, comprising steps of:

providing an undercoat layer comprising hollow microspheres on an aluminum or aluminum alloy sheet support, forming a filmy layer of aluminum hydrate by subjecting the undercoat layer to hydrate treatment, and forming on the filmy layer of aluminum hydrate an oxide film layer as the topmost layer by subjecting the aluminum hydrate filmy layer to anodic oxidation treatment.

* * * * *